(12) United States Patent
Wu et al.

(10) Patent No.: US 10,889,493 B2
(45) Date of Patent: Jan. 12, 2021

(54) MEMS METHOD AND STRUCTURE

(71) Applicant: Taiwan Semiconductor Manufacturing Company, Ltd., Hsinchu (TW)

(72) Inventors: Ting-Hau Wu, Yilan (TW); Kuei-Sung Chang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/228,286

(22) Filed: Dec. 20, 2018

(65) Prior Publication Data

US 2019/0119105 A1  Apr. 25, 2019

Related U.S. Application Data

(60) Continuation of application No. 15/212,827, filed on Jul. 18, 2016, now Pat. No. 10,160,642, which is a division of application No. 13/827,928, filed on Mar. 14, 2013, now Pat. No. 9,394,164.

(60) Provisional application No. 61/778,135, filed on Mar. 12, 2013.

(51) Int. Cl.
*B81C 1/00* (2006.01)
*B81B 3/00* (2006.01)

(52) U.S. Cl.
CPC ........ *B81C 1/00801* (2013.01); *B81B 3/0021* (2013.01); *B81C 1/00587* (2013.01); *B81B 2201/0235* (2013.01); *B81B 2207/012* (2013.01); *B81B 2207/015* (2013.01); *B81C 2201/0132* (2013.01); *B81C 2201/0133* (2013.01); *B81C 2203/036* (2013.01)

(58) Field of Classification Search
CPC ............ B81C 1/00801; B81C 1/00587; B81C 2201/0133; B81C 2203/036; B81C 2201/0132; B81B 3/0021; B81B 2207/015; B81B 2207/012; B81B 2201/0235

See application file for complete search history.

(56) References Cited

U.S. PATENT DOCUMENTS

| | | | | |
|---|---|---|---|---|
| 6,090,638 A * | 7/2000 | Vigna | ................. | B81C 1/00246 257/E21.573 |
| 6,854,330 B2 * | 2/2005 | Potter | .................. | G01P 15/125 310/309 |
| 7,059,190 B2 * | 6/2006 | Sakai | ................. | G01P 15/0802 361/280 |
| 7,180,019 B1 * | 2/2007 | Chiou | ................ | G01P 15/0891 200/61.45 M |
| 7,736,931 B1 * | 6/2010 | Guo | ....................... | G01P 15/02 438/52 |
| 8,692,337 B2 * | 4/2014 | Berthelot | .............. | G01P 15/125 257/415 |
| 9,725,310 B2 * | 8/2017 | Cheng | ................ | B81C 1/00246 |

(Continued)

*Primary Examiner* — Edward Chin
(74) *Attorney, Agent, or Firm* — Slater Matsil, LLP

(57) ABSTRACT

MEMS structures and methods utilizing a locker film are provided. In an embodiment a locker film is utilized to hold and support a moveable mass region during the release of the moveable mass region from a surrounding substrate. By providing additional support during the release of the moveable mass, the locker film can reduce the amount of undesired movement that can occur during the release of the moveable mass, and preventing undesired etching of the sidewalls of the moveable mass.

20 Claims, 4 Drawing Sheets

(56) References Cited

U.S. PATENT DOCUMENTS

| | | | | |
|---|---|---|---|---|
| 2004/0047203 | A1* | 3/2004 | Lee | H01L 27/115 365/202 |
| 2006/0096947 | A1* | 5/2006 | Harris | H01G 5/40 216/13 |
| 2006/0163679 | A1* | 7/2006 | Lafond | G01P 15/18 257/414 |
| 2007/0158767 | A1* | 7/2007 | Sinclair | B81B 3/004 257/415 |
| 2008/0049296 | A1* | 2/2008 | Stalford | H02N 10/00 359/290 |
| 2010/0005884 | A1* | 1/2010 | Weinberg | G01C 19/5719 73/504.15 |
| 2010/0006972 | A1* | 1/2010 | La Tulipe, Jr. | H01L 24/94 257/499 |
| 2010/0240215 | A1* | 9/2010 | Huang | H01G 7/00 438/669 |
| 2012/0125885 | A1* | 5/2012 | Chen | G11B 5/23 216/22 |
| 2012/0184092 | A1* | 7/2012 | Ooi | H01L 21/31116 438/519 |
| 2014/0264644 | A1 | 9/2014 | Wu et al. | |
| 2016/0221819 | A1* | 8/2016 | Smeys | B81B 7/0041 |
| 2016/0325988 | A1 | 11/2016 | Wu et al. | |

* cited by examiner

MEMS METHOD AND STRUCTURE

This application is a continuation of U.S. patent application Ser. No. 15/212,827, filed Jul. 18, 2016, entitled, "MEMS Method and Structure," which is a divisional and claims the benefit of U.S. patent application Ser. No. 13/827,928, filed on Mar. 14, 2013, now U.S. Pat. No. 9,394,164, issued Jul. 19, 2016, entitled "MEMS Method and Structure," which application claims the benefit of U.S. Provisional Application No. 61/778,135, filed on Mar. 12, 2013, entitled "MEMS Method and Structure", which applications are hereby incorporated herein by reference.

BACKGROUND

Microelectromechanical system (MEMS) devices have been recently utilized in order to obtain devices with variable physical properties. Examples of these MEMS devices include devices with variable physical properties, such as accelerometers, digital micromirror devices (DMDs), and devices with variable electrical properties, such as variable capacitors or variable inductors. Generally, each of these MEMS devices comprises a moveable piece whose movement, when actuated by, e.g., an electrode, causes a change in the variable property of the device.

Generally, well-known semiconductor manufacturing techniques have been utilized to great effect in forming these moveable pieces within the MEMS devices. Using these techniques, parts which are intended to be moveable are initially manufactured as an immoveable layer. Following the completion of the manufacturing of the moveable piece, the moveable layer is patterned, thereby freeing the moveable piece to move.

Additionally, to meet customer demands for smaller and smaller devices, the MEMS devices also need to be reduced in size so that they fit into the desired packages (e.g., mobile phones, music players, etc.). However, in this race to manufacture devices as small as possible to meet customer demands, technological improvements must improve as well. In particular, as sizes are scaled down, issues that were previously acceptable at larger sizes become more critical and can actually impact performance or yield of a production process or even the performance of the finished devices themselves.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a MEMS device with a moveable mass. The invention may also be applied, however, to other MEMS devices and other types of devices.

Figure 1:
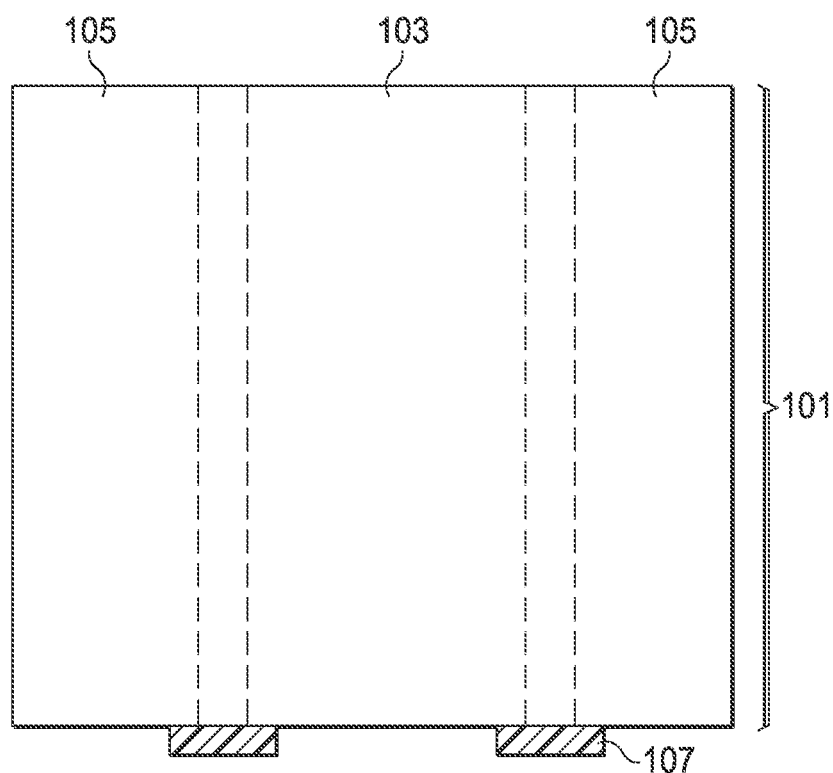
FIG. 1 illustrates a first substrate with a moveable mass region in accordance with an embodiment.

With reference now to FIG. 1, there is shown a first substrate 101 with a moveable mass region 103 and two support regions 105. The first substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The moveable mass region 103 may be a region of the first substrate 101 which will eventually be released from the remainder of the first substrate 101 to form a moveable mass 401 (not illustrated in FIG. 1 but illustrated and described further below with respect to FIG. 4) so that the moveable mass 401 can move relative to the remainder of the first substrate 101. In an embodiment the moveable mass 401 may be, e.g., a solid mass for a MEMS based accelerometer, a gyroscope, a microphone, a motion sensor, a pressure sensor, a rotating mirror as part of a digital micromirror device, a capacitor plate as part of a variable capacitance capacitor, combinations of these, or the like. The moveable mass region 103 may be formed into the moveable mass 401 as desired for any suitable purpose in a MEMS device, and all such purposes are fully intended to be included within the scope of the embodiments.

In an embodiment the support regions 105 surround the moveable mass region 103 and are used to provide physical and electrical support to the moveable mass 401 once the moveable mass 401 has been released from the remainder of the first substrate 101. In an embodiment the support regions 105 may remain connected to the moveable mass 401 by, e.g., a spring section (not individually illustrated in FIG. 1) in order to provide physical support to the moveable mass 401 as well as providing a spring force to return the moveable mass 401 back to a default position once the moveable mass 401 has been moved out of position.

Additionally, the support regions 105 may also provide electrical connectivity (if desired) to the moveable mass 401 once the moveable mass 401 has been separated from the remainder of the first substrate 101. For example, in an embodiment in which the moveable mass 401 is a capacitance type accelerometer, the support regions 105 may also provide, e.g., a capacitor plate (not individually illustrated in FIG. 1) that is complementary to a capacitor plate (also not individually illustrated in FIG. 1) formed on the moveable mass 401. Alternatively, support regions 105 may also provide electrical connectivity to and from the moveable mass 401 itself, e.g., by routing power, ground or electrical signals through the support regions 105 and also through, e.g., the spring section.

FIG. 1 also illustrates the formation of a locker film 107 or support film on a first side of the first substrate 101. In an embodiment the locker film 107 provides physical support between the moveable mass region 103 and the support regions 105 during the release of the moveable mass region 103 to form the moveable mass 401. In an embodiment the locker film 107 comprises any support material, such as silicon oxide, silicon nitride, a combination of silicon oxide and silicon nitride, silicon carbide, polysilicon, silicon, aluminum, aluminum copper, titanium, titanium nitride, tantalum nitride, copper, combinations of these, or the like.

Alternatively, the locker film 107 may be made from a sacrificial material that may be completely removed once the moveable mass region 103 has been released to form the moveable mass 401. In this embodiment the locker film 107 may comprise a material such as amorphous carbon or a polymer photoresist. However, any other suitable material that may be removed once the first substrate 101 is bonded to a second substrate 201 (not illustrated in FIG. 1 but illustrated and discussed below with respect to FIG. 2) may alternatively be utilized, and all such materials are fully intended to be included within the scope of the embodiments.

The method of formation of the locker film 107 will depend upon the precise material chosen for the locker film 107. For example, in an embodiment in which the locker film 107 is silicon oxide, a deposition process such as chemical vapor deposition (CVD), physical vapor deposition (PVD), atomic layer deposition (ALD), combinations of these, or the like may be used, or another method of formation, such as an anneal in an oxidizing ambient, may alternatively be utilized. Alternatively, if a photoresist material is used for the locker film 107, a method such as spin-on-coating may be utilized to place the locker film 107 on the first substrate 101. Any suitable method of formation may be utilized to form the locker film 107, and all such methods are fully intended to be included within the scope of the embodiments.

The locker film 107 may be formed to a thickness that is suitable to provide the desired support for the moveable mass region 103 during the release of the moveable mass region 103 to form the moveable mass 401. As such, the precise thickness of the locker film 107 may be based at least in part upon the thickness of the moveable mass region 103 and the support regions 105. For example, in an embodiment in which the moveable mass region 103 and the support regions 105 have a thickness of between about 5 µm and about 100 µm, such as about 30 µm, the locker film 107 may be formed to a thickness of between about 500 Å and about 10 µm, such as about 1.5 µm.

Once formed, the locker film 107 may be patterned using, e.g., a photolithographic masking and etching process, whereby a photosensitive material is applied to the locker film 107 and then exposed to a patterned energy (e.g., light) and developed to expose portions of the locker film 107. In one embodiment the locker film 107 is patterned to provide support around those regions which will be removed. As such, the locker film 107 may extend between the support region 105 to the moveable mass region 103. In alternative embodiments, the locker film 107 may be patterned to provide a surface for bonding but otherwise covers the first substrate 101.

Figure 2:
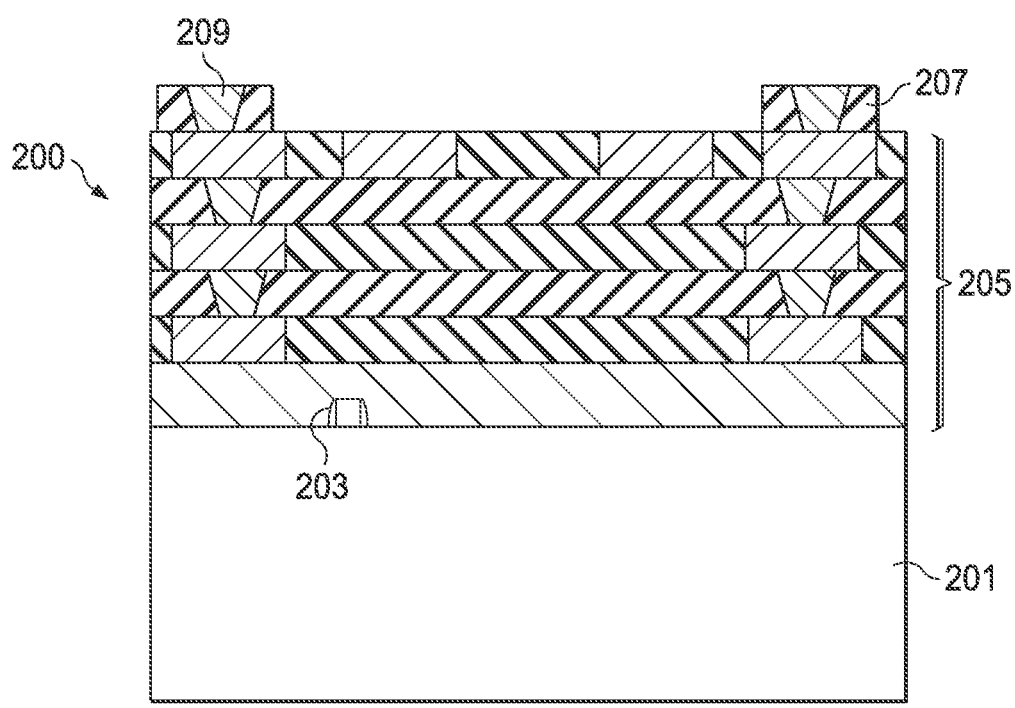
FIG. 2 illustrates a CMOS layer to which the first substrate will be attached in accordance with an embodiment.

FIG. 2 illustrates a CMOS layer 200 to which the first substrate 101 will be bonded so that the CMOS layer 200 can provide control and connectivity to the first substrate 101. In an embodiment the CMOS layer 200 comprises a second substrate 201, active devices 203, metallization layers 205, a passivation layer 207, and contacts 209 within the passivation layer 207. In an embodiment the second substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices 203 may be formed on the second substrate 201 in order to send signals to, receive signals from, or otherwise control and utilize the moveable mass 401 once the moveable mass 401 has been released from the first substrate 101. As one of ordinary skill in the art will recognize, while only a single one of the active devices 203 is illustrated in FIG. 2, a wide variety of active devices 203 such as transistors, capacitors, resistors, inductors and the like may be used to generate the desired structural and functional requirements of the design for the MEMS device 500 (illustrated in FIG. 5 after the release of the moveable mass 401). The active devices 203 may be formed using any suitable methods either within or else on the surface of the second substrate 201.

The metallization layers 205 are formed over the second substrate 201 and the active devices 203 and are designed to connect the various active devices 203 to form functional circuitry and also to provide connectivity to the first substrate 101. The metallization layers 205 may be formed of alternating layers of dielectric (e.g., low-k dielectric material) and conductive material (e.g., copper), with vias extending through the dielectric layers to connect the layers of conductive material, and may be formed through any suitable process (such as deposition, damascene, dual damascene, etc.). In an embodiment there may be three layers of metallization separated from the second substrate 201 by at least one interlayer dielectric layer (ILD), but the precise number of layers within the metallization layers 205 is dependent upon the design of the MEMS device 500.

The passivation layer 207 may be formed over the metallization layers 205 to protect the metallization layers 205 and also to space the metallization layers 205 from the first substrate 101 such that the moveable mass 401 may freely move without undesired physical contact between the moveable mass 401 and the metallization layers 205. In an embodiment the passivation layer 207 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 207 may be formed through a process such as chemical vapor deposition (CVD), although any suitable process may be utilized, and may have a thickness between about 0.5 µm and about 5 µm, such as about 9.25 KÅ.

Additionally, contacts 209 may be formed within the passivation layer 207 in order to provide electrical connectivity to the first substrate 101. The contacts 209 may be a conductive material such as copper and may be formed using, e.g., a damascene process in which openings (not individually illustrated in FIG. 2) are initially formed in the layer of dielectric material (prior to the patterning of the dielectric material to form the passivation layer 207) and the openings are then overfilled and planarized to form the contacts 209. However, any suitable method of forming the contacts 209 may alternatively be utilized and all such methods are fully intended to be included within the scope of the embodiments.

Additionally, as one of ordinary skill in the art will recognize, the precise type and method of formation of the contacts 209 described above are intended to be illustrative and are not intended to be limiting to the embodiments. Rather, any suitable type of electrical and physical connection, and any method of forming the electrical and physical connection, may alternatively be used. For example, the contacts 209 may be formed by initially depositing a layer of a conductive material such as aluminum, and then patterning the layer, or the contacts 209 may be a copper pillar formed using a plating process. Any suitable structure and method may be utilized, and all such structures and methods are fully intended to be included within the scope of the embodiments.

Once formed, the passivation layer 207 may be patterned to provide a space for the moveable mass 401 to move freely once the moveable mass region 103 has been released from the rest of the first substrate 101. In an embodiment the passivation layer 207 may be patterned using, e.g., a photolithographic masking and etching process. In such a process a photoresist (not individually illustrated in FIG. 2) is applied to the passivation layer 207, exposed to a patterned energy source (e.g., light), and developed to expose portion of the passivation layer 207 that are desired to be removed. Once developed, the exposed portions of the passivation layer 207 are removed using an etching process, and the photoresist is removed using, e.g., a thermal ashing process.

Figure 3:
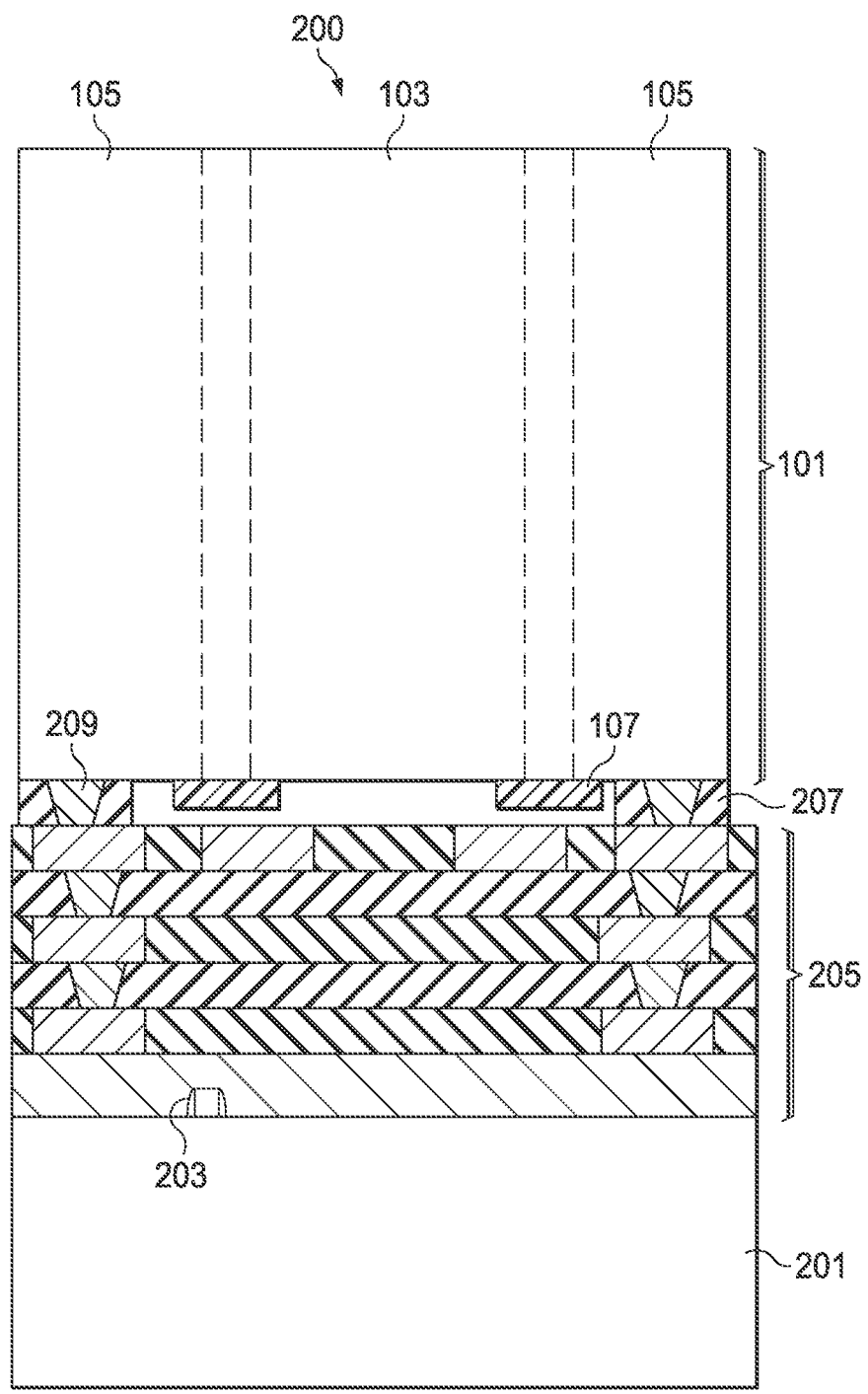
FIG. 3 illustrates a bonding of the first substrate to the CMOS layer in accordance with an embodiment of the present invention.

FIG. 3 illustrates a bonding of the first substrate 101 to the CMOS layer 200. In an embodiment the first substrate 101 is bonded to the CMOS layer 200 using, e.g., a fusion bonding process. In an embodiment the fusion bonding may be performed by initially exposing the surfaces (e.g., silicon) of the first substrate 101 to a plasma environment. Once exposed, the first substrate 101 is then aligned with the second substrate 201 and the two are contacted together to initiate a bonding of the first substrate 101 with the second substrate 201.

Once the bonding has been initiated by contacting the first substrate 101 to the second substrate 201, the bonding process may be continued to strengthen the bonding by heating the first substrate 101 and the second substrate 201. In an embodiment this heating may be performed by annealing the first substrate 101 and the second substrate 201 at a temperature of between about 150° C. and about 800° C. in order to strengthen the bond. However, any suitable method, including allowing the first substrate 101 and the second substrate 201 to bond at room temperature, may alternatively be used, and all such bonding is fully intended to be included within the scope of the embodiments.

Alternatively, a wet cleaning procedure may be utilized to initiate the fusion bond between the first substrate 101 and the second substrate 201. For example, in an embodiment in which the first substrate 101 is silicon, the first substrate 101 may be bonded by initially cleaning the first substrate 101 using, e.g., a wet cleaning procedure such as an SC-1 or SC-2 cleaning procedure to form a hydrophilic surface. The first substrate 101 is then aligned with the second substrate 201 and the two are contacted together to begin the bonding procedure. Once the first substrate 101 has contacted the second substrate 201, the thermal anneal may be utilized to strengthen the bond.

In yet another embodiment, the first substrate 101 may be bonded by first treating the first substrate 101 to form a hydrophobic surface. For example, in an embodiment the first substrate 101 may be etched using an etching solution of hydrogen fluoride (HF) or ammonium fluoride ($NH_4F$). Once treated, the first substrate 101 is then aligned with the second substrate 201 and placed in contact. The contacted first substrate 101 and second substrate 201 are then annealed to strengthen the bond.

However, the descriptions of the fusion bonding using a plasma exposure, a cleaning process, or an etching solution as described above are merely examples of types of process that may be utilized in order to bond the first substrate 101 to the second substrate 201, and are not intended to be limiting upon the embodiments. Rather, any suitable bonding process may alternatively be utilized to bond the first substrate 101 to the second substrate 201, and all such processes are fully intended to be included within the embodiments.

Figure 4:
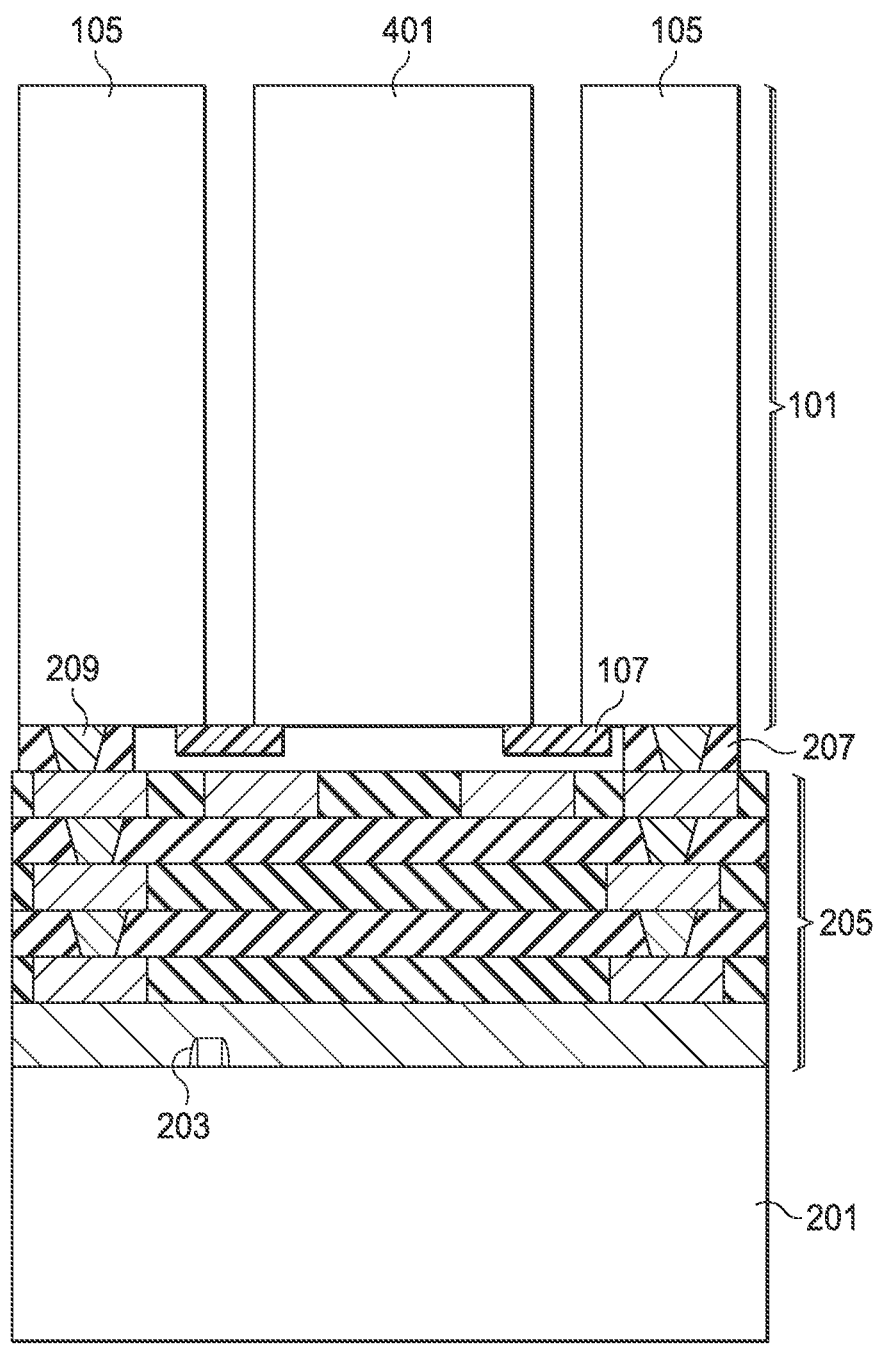
FIG. 4 illustrates a patterning of the first substrate to form a locked moveable mass region in accordance with an embodiment of the present invention.

FIG. 4 illustrates that, once the first substrate 101 has been bonded to the second substrate 201, the moveable mass region 103 may be released from the first substrate 101 to form the moveable mass 401. In an embodiment the moveable mass region 103 may be released using, e.g., a deep reactive ion etch (DRIE) to etch through the first substrate 101 between the moveable mass region 103 and the support regions 105.

In an embodiment the DRIE process may comprise a time-multiplexed etching which uses a series of etches and depositions in order to achieve a nearly vertical sidewall. In such an embodiment a first photoresist (not individually illustrated in FIG. 4) may be initially placed over the first substrate 101. Once in place, the first photoresist may be exposed to a patterned energy source (e.g., light) in order to induce a chemical reaction within portions of the first photoresist. These chemically altered portions of the first photoresist may then be removed by a development process in order to expose regions of the first substrate 101 between the moveable mass region 103 and the support regions 105.

Once the first photoresist has been developed and the sections of the first substrate 101 between the moveable mass region 103 and the support regions 105 have been exposed, a series of etching processes and deposition processes may be performed in alternate steps. For each etching process, a reactive ion etch with an etchant selective to the material of the first substrate 101 (e.g., silicon), such as sulfur hexafluoride, is utilized to etch the exposed surfaces of the first substrate 101. For each deposition process, a passivation material, such as a polymer formed using trifluoromethane and argon, is deposited along the sidewalls and bottom of the opening formed by the etching processes.

When the next etching process is performed, the etching process will remove the passivation material from the bottom of the opening, while at least a portion of the passivation material remains along the sidewalls to protect the sidewalls from the etching process. In such a manner, the DRIE can achieve very high aspects rations for the release of the moveable mass region 103 to form the moveable mass 401.

However, the DRIE described above is not intended to be limiting the embodiments. Any suitable DRIE process, including a cryogenic process wherein the chemical reaction of the ions is slowed down to inhibit any lateral etching, and any other suitable etching or removal process, may be used to release the moveable mass region 103 from the rest of the first substrate 101. All such process are fully intended to be included within the scope of the embodiments.

Given the natural variation in thicknesses that can occur in the first substrate 101, the DRIE process can actually release one section of the first substrate 101 prior to releasing another section of the first substrate. As such, the release of the moveable mass region 103 may occur on one side of the moveable mass region 103 faster than on another side, and an overetch may be needed to ensure that both of the openings extend all the way through the first substrate 101. As such, these releases can occur at different times and can cause one section to undergo deformations caused by the uneven release of internal stresses. These internal stresses can cause the moveable mass region 103 to move during the DRIE process, causing striations and undesired etching to occur on sidewalls of the moveable mass region 103 as it is being released from the rest of the first substrate 101.

However, the presence of the locker film 107 holds, steadies, and provides support for the moveable mass region 103 by providing a connection between the moveable mass region 103 and the support regions 105. This support steadies the moveable mass region 103 during the time period of the overetch process, during which one section of the moveable mass region 103 may be released while another section of the moveable mass region 103 is in the process of being released. As such, the moveable mass region 103 will have a reduced or eliminated movement during the etching process, and reduced or lessened striations will result on the sidewalls of the moveable mass region 103.

Figure 5:
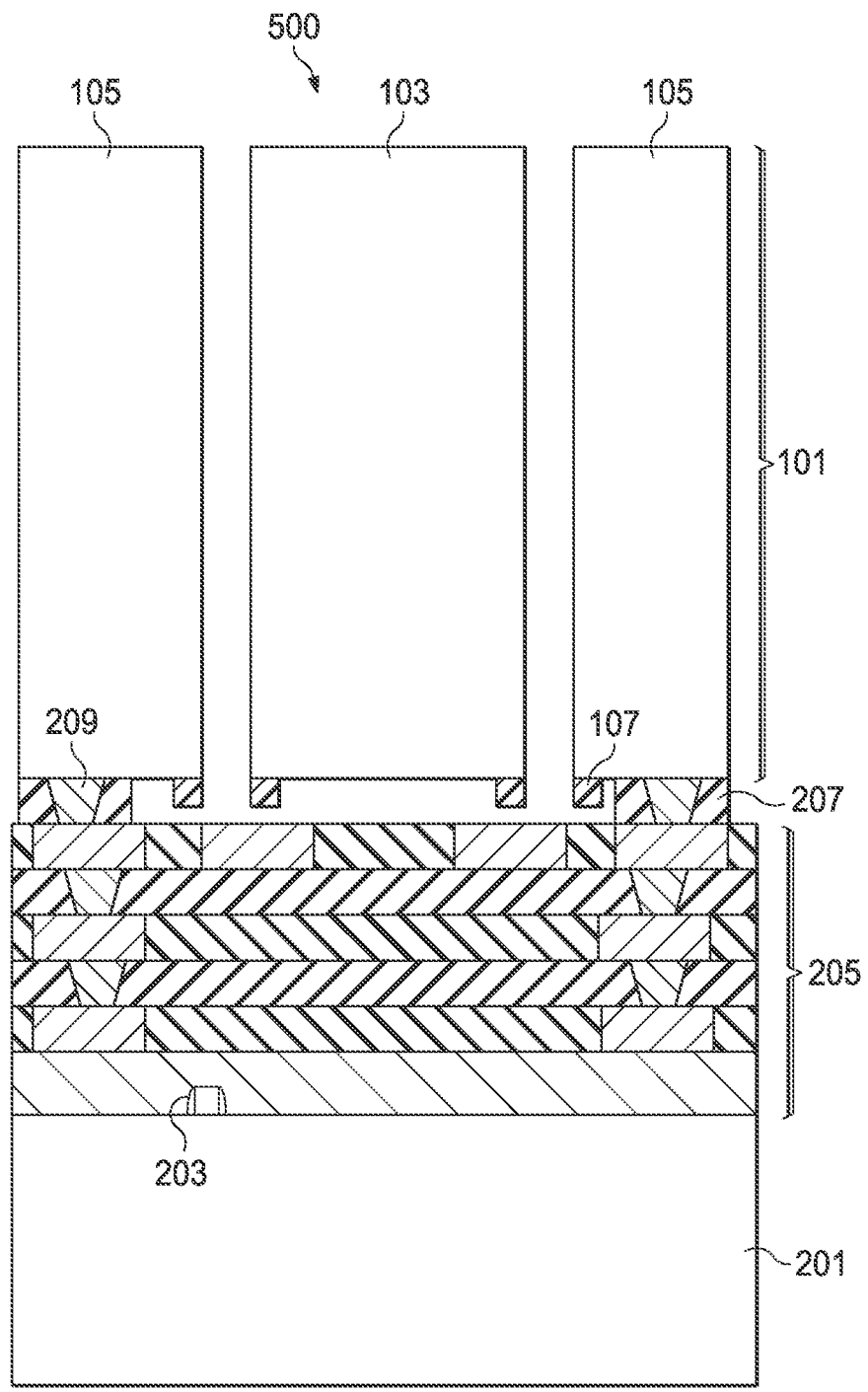
FIG. 5 illustrates a release of the moveable mass region to form a moveable mass in accordance with an embodiment of the present invention.

FIG. 5 illustrates that, once the moveable mass region 103 has been released from the first substrate 101 to form the moveable mass 401, the locker film 107 may be etched in order to fully release moveable mass 401 and allow the moveable mass 401 to move, thereby forming the MEMS device 500. In an embodiment the locker film 107 may be etched using a process such as reactive ion etching along with an etchant that is selective to the material of the locker film 107, resulting in the locker film 107 having sidewalls that are aligned with the sidewalls of the moveable mass 401 and the support regions 105. For example, in an embodiment in which the locker film 107 is silicon oxide, an etchant such as a wet hydrogen fluoride (HF), a vapor type HF, any other F-based dry etching, or the like, may be utilized in order to etch through the locker film 107 release the moveable mass 401. However, any suitable removal process may alternatively be utilized.

Alternatively, in an embodiment in which the locker film 107 is a sacrificial material, the locker film 107 may be completely removed from the moveable mass 401 and the support regions 105. For example, in an embodiment in which the locker film 107 is a photoresist material, an ashing process may be performed to thermally decompose the photoresist material, while in an embodiment in which the locker film 107 is amorphous carbon, the locker film 107 may be removed after the dry etch by performing a wet cleaning process. These and all other suitable methods of separating the locker film 107 and/or removing the locker film 107 are fully intended to be included within the scope of the embodiments.

By using the locker film 107 to hold and support the moveable mass region 103 until the overetch has been completed, striations along the sidewall can be reduced or eliminated. If the locker film 107 is not utilized, an uneven etching and striations can occur when the moveable mass 401 is allowed to shift during the release process.

In accordance with an embodiment, a method of manufacturing a microelectromechanical structure comprising forming a locker film on a first surface of a first substrate, the first substrate comprising a moveable mass region and a support region, is provided. The first substrate is etched to release the moveable mass region from the support region, the etching stopping on the support film, and at least a portion of the locker film is removed to release the moveable mass region.

In accordance with yet another embodiment, a method of manufacturing a microelectromechanical structure comprising providing a first substrate with active devices located in the first substrate and forming a support film on a first surface of a second substrate is provided. The first substrate is bonded to the second substrate, the first surface facing the first substrate. A moveable mass region within the second substrate is released while the moveable mass region is supported with the support film, and at least a portion of the support film is removed to remove the support of the support film.

In accordance with yet another embodiment, a microelectromechanical structure comprising a moveable mass separated from a support region, the moveable mass being moveable relative to a support region, is provided. A first support film is located on the moveable mass, the first support film having a first edge aligned with an edge of the moveable mass and a second support film is located on the support region, the second support film having a second edge aligned with an edge of the support region, wherein the first support film and the second support film comprise the same material.

Although the present invention and its advantages have been described in detail, it should be understood that various changes, substitutions and alterations can be made herein without departing from the spirit and scope of the invention as defined by the appended claims. For example, the embodiments described herein may be utilized in the formation of many different types of MEMS devices. Further, various materials and processes may be used to form the support film and help to support the moveable mass during an overetch.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a microelectromechanical structure, the method comprising:
   forming a support film on a first surface of a first substrate, the first substrate comprising two support regions and a movable mass region between the two support regions, the support film covering first areas of the first surface of the first substrate and exposing second areas of the first surface of the first substrate;
   after forming the support film, bonding the second areas of the first surface of the first substrate to a second substrate; and
   after the bonding, separating the movable mass region from the two support regions by removing portions of the first substrate between the two support regions and the movable mass region, wherein separating the movable mass region separates the support film into a first segment attached to the movable mass region and second segments attached to the two support regions, wherein the first segment of the support film has a first side facing the second substrate and has a second side facing away from the second substrate, the second side being fully covered by the movable mass region.

2. The method of claim 1, wherein the first areas of the first surface of the first substrate are between the two support regions and the movable mass region.

3. The method of claim 1, wherein after the bonding, there is a gap between the first surface of the first substrate and the second substrate.

4. The method of claim 1, wherein the bonding comprise bonding the second areas of the first surface of the first substrate to conductive pillars in a passivation layer over the second substrate, wherein the conductive pillars physically contact the first substrate after the bonding.

5. The method of claim 4, wherein after the bonding, the passivation layer over the second substrate physically contacts the second areas of the first surface of the first substrate.

6. The method of claim 1, wherein separating the movable mass region is performed using an isotropic etching process.

7. The method of claim 1, wherein separating the movable mass region from the two support regions comprises forming an opening through the first substrate, the opening exposing a first sidewall of the first substrate, a second sidewall of the first substrate opposing the first sidewall, and a surface of the support film facing the first substrate.

8. The method of claim 7, wherein separating the movable mass region further comprises performing an etching process to extend the opening through the support film.

9. The method of claim 8, wherein after the etching process, the opening exposes a third sidewall of the support film and fourth sidewall of the support film opposing the third sidewall, wherein the third sidewall is aligned with the first sidewall, and the fourth sidewall is aligned with the second sidewall.

10. The method of claim 1, wherein bonding the first surface of the first substrate to the second substrate comprises:
exposing the first surface of the first substrate to a plasma;
aligning and contacting the first surface of the first substrate with the second substrate after the exposing; and
annealing the first substrate and the second substrate.

11. The method of claim 1, wherein bonding the first surface of the first substrate to the second substrate comprises:
performing a wet cleaning process to the first surface of the first substrate, wherein the first surface of the first substrate becomes a hydrophilic surface after the wet cleaning process;
aligning and contacting the first surface of the first substrate with the second substrate after the wet cleaning process; and
performing a thermal anneal process.

12. The method of claim 1, wherein bonding the first surface of the first substrate to the second substrate comprises:
treating the first surface of the first substrate to form a hydrophobic surface;
aligning and contacting the first surface of the first substrate with the second substrate after the treating; and
performing an anneal process.

13. A method of manufacturing a microelectromechanical structure, the method comprising:
forming a support film on a first side of a first substrate, wherein the first substrate comprises a movable mass region and a support region adjacent to the movable mass region, wherein the support film extends continuously from the support region to the movable mass region, wherein the support film covers a first area of the first side of the first substrate and exposes a second area of the first side of the first substrate;
after forming the support film, releasing the movable mass region from the support region by forming an opening through the first substrate between the support region and the movable mass region, wherein the support film extends continuously from the support region to the movable mass region after the releasing; and
etching through the support film after the releasing, wherein the etching through separates the support film into a first segment attached to the movable mass region and a second segment attached to the support region, wherein a surface of the first segment of the support film facing the movable mass region is fully covered by the movable mass region.

14. The method of claim 13, further comprising, before releasing the movable mass region, bonding the first side of the first substrate to a second side of a second substrate, wherein after the bonding, the first side of the first substrate is in physical contact with a passivation layer at the second side of the second substrate, and there is a gap between the first side of the first substrate and the second substrate.

15. The method of claim 13, wherein releasing the movable mass region comprises performing an etching process and a deposition process alternately.

16. The method of claim 15, wherein performing the etching process comprises performing an isotropic etching process, and performing the deposition process comprise depositing a passivation material along sidewalls and a bottom of the opening.

17. A method of manufacturing a microelectromechanical structure, the method comprising:
forming a support material on a first surface of a first substrate, the first substrate having a movable mass region and a support region adjacent to the movable mass region;
patterning the support material to form a support film, the support film comprising a plurality of segments that are spaced apart from each other, the support film extending along the first surface of the first substrate from the movable mass region to the support region, the support film covering a first area of the first surface of the first substrate while exposing a second area of the first surface of the first substrate;
after patterning the support material, forming a first opening in the first substrate between the movable mass region and the support region, the first opening extending through the first substrate but not through the support film; and
after forming the first opening, forming a second opening through the support film, the second opening aligned with the first opening.

18. The method of claim 17, further comprising, before forming the first opening, bonding the first surface of the first substrate to conductive pillars disposed in a dielectric layer at a second surface of a second substrate, wherein after the bonding, there is a gap between the first surface of the first substrate and the second substrate.

19. The method of claim 18, wherein the support material is silicon oxide, silicon nitride, silicon carbide, polysilicon, silicon, aluminum, aluminum copper, titanium, titanium nitride, tantalum nitride, copper, or combinations thereof.

20. The method of claim 18, wherein forming the second opening separates a first segment of the support film into a first portion attached to the movable mass region and a second portion attached to the support region, wherein a first surface of the first portion is exposed to the gap, and a second opposing surface of the first portion is completely covered by the movable mass region.

* * * * *